(12) United States Patent
Jin et al.

(10) Patent No.: US 6,225,801 B1
(45) Date of Patent: May 1, 2001

(54) ARTICLE COMPRISING ELECTRONIC CIRCUITS AND DEVICES WITH MAGNETICALLY PROGRAMMABLE ELECTRICAL RESISTANCE

(75) Inventors: Sungho Jin, Millington; Hareesh Mavoori, Berkeley Heights, both of NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/231,566

(22) Filed: Jan. 14, 1999

(51) Int. Cl.⁷ .................................................. G01R 33/02
(52) U.S. Cl. ..................... 324/252; 428/692; 428/332; 338/32 R; 360/324.11
(58) Field of Search ..................... 324/252; 338/32 R, 338/12; 335/165, 166, 167; 372/20; 361/191; 323/94, 368; 428/692, 332; 360/324.11

(56) References Cited

U.S. PATENT DOCUMENTS 3,172,032 * 3/1965 Hunt ........................................ 323/66
5,999,546 * 12/1999 Espindola et al. ..................... 372/20

OTHER PUBLICATIONS

Levy, Peter M., "Giant Magnoresistance in Magnetic Layered and Granular Materials", Science, vol. 256, p. 972 (1992), pp. 972–973.
Fullerton, E. E., "150% Magnetoresistance in Sputtered Fe/Cr(100) Superlattices", Applied Physics Letters, vol. 63, pp. 1699–1701 (1993).
Hylton, T. L., "Giant Magnetoresistance at Low Fields in Discintinuous NiFe–Ag Multilayer Thin Films", Science, vol. 261, pp. 1021–1024, Aug. 20, 1993.
Prinz, Gary A., "Spin–Polarized Transport", Physics Today, pp. 58–63, Apr. 1995.
Jin et al., Science, vol. 264, pp. 413–415, (1994).
Jin et al., JOM, vol. 49, No. 3, Mar. 1997, p. 61–63.

* cited by examiner

Primary Examiner—Hezron Williams
Assistant Examiner—Anthony Jolly
(74) Attorney, Agent, or Firm—Mathews, Collins, Shepherd & Gould, P.A.

(57) ABSTRACT

In accordance with the invention, an electrical or electronic circuit is provided with one or more components of magnetoresistive material and disposed within the gap of a programmable and latchable magnet. This provides the circuit with programmable and latchable resistivity, particularly useful in transformers, amplifiers and frequency tuners.

10 Claims, 6 Drawing Sheets

NOTE: $R_1C_2 \gg R_2C_2$

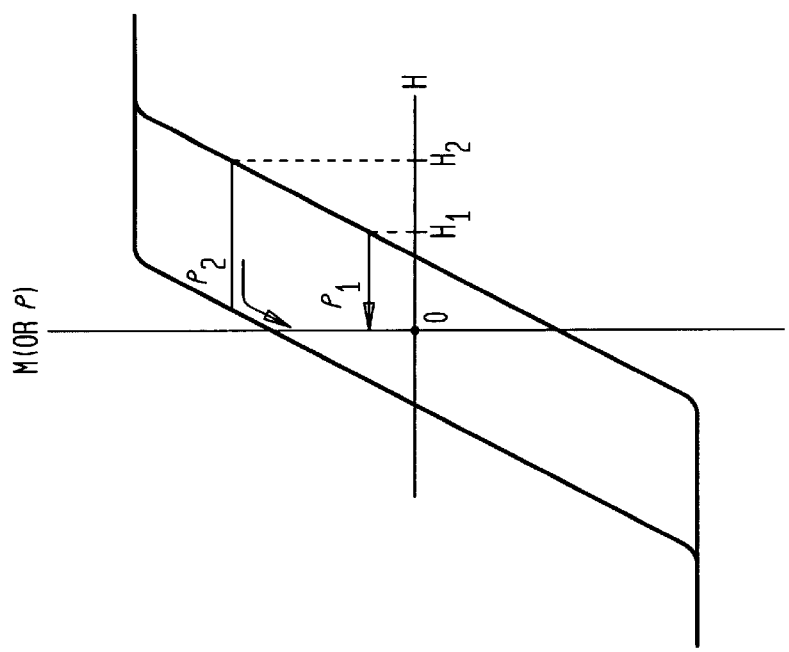
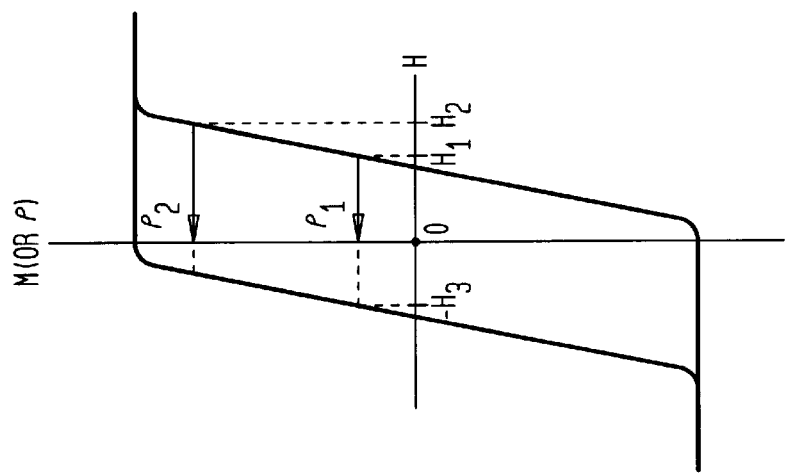
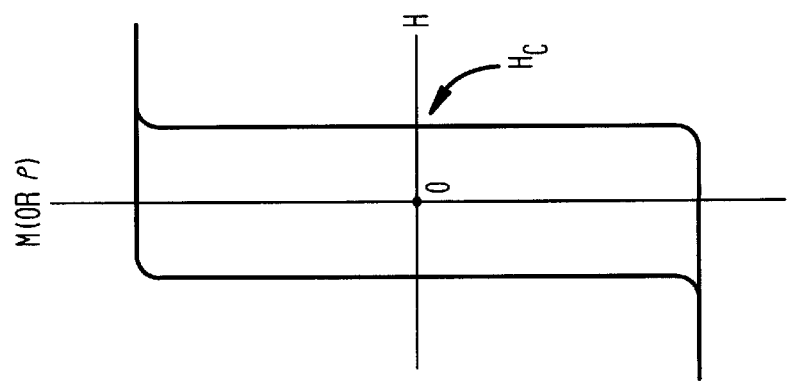

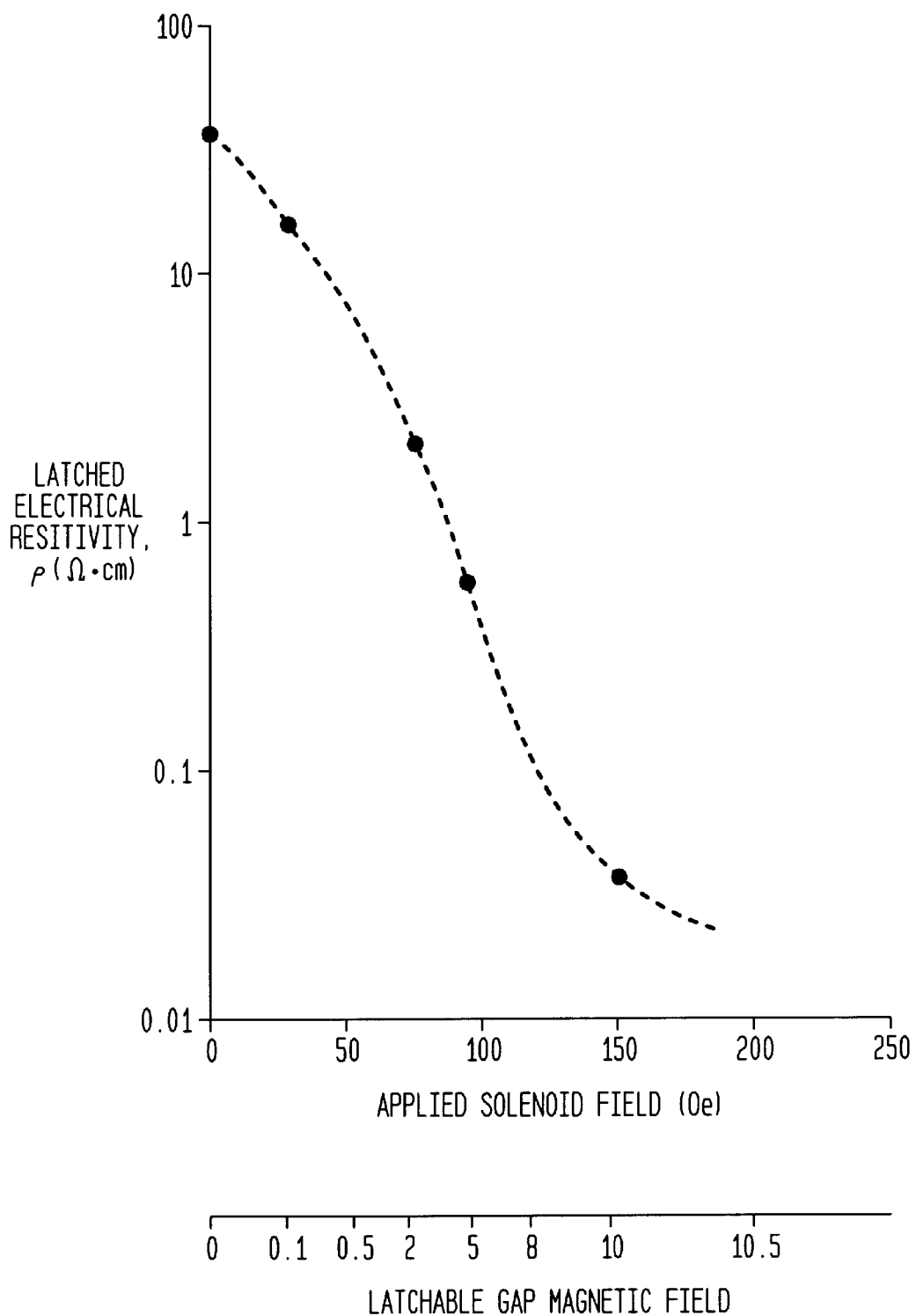

ARTICLE COMPRISING ELECTRONIC CIRCUITS AND DEVICES WITH MAGNETICALLY PROGRAMMABLE ELECTRICAL RESISTANCE

FIELD OF THE INVENTION

This invention pertains to devices comprising electronic and electrical circuits with programmable electrical resistance, and in particular, to circuits comprising components having magnetically tunable and latchable resistivity.

BACKGROUND OF THE INVENTION

Electrical and electronic circuits generally follow Ohm's law, V=IR, with circuit components having material-specific electrical resistivity. It would be advantageous if the resistance of one or more circuit components were easily tunable so that circuit parameters such as voltage, current, power, or resonance frequency were tunable. While there are highly magnetoresistive materials having electrical resistivity sensitive to applied magnetic field, these materials typically require continuous power to maintain a change in resistivity.

One well-known technique for altering the electrical resistivity of a material is to vary the temperature. However, temperature control is cumbersome and requires sustained power to maintain a desired temperature. An elevated operating temperature is also likely to cause undesirable changes in other circuit components.

It is known that a magnetic field can affect the resistivity in magnetoresistive (MR) materials. The "magnetoresistance" (MR) of a material is the resistance R(H) of the material in an applied field H less the resistance $R_o$ in the absence of an applied field, i.e. MR=R(H)–$R_o$. The resistance difference MR is typically normalized, by dividing by R(H) and expressed as a MR ratio in percent:

MR ratio=(R(H)–$R_o$)/R(H)

Conventional magnetic materials (e.g., permalloy) typically have a positive MR ratio of a few percent. Recently, relatively large values of MR ratio were observed in metallic multilayer structures, e.g. Fe/Cr or Cu/Co. See, for instance, P. M. Levy, *Science*, Vol. 256, p. 972 (1992); E. F. Fullerton, *Applied Physics Letters*, Vol. 63, p. 1699 (1993); and T. L. Hylton, *Science*, vol. 265, p. 1021 (1993). More recently, very large changes in electrical resistivity have been induced in certain types of MR materials, such as the colossal magnetoresistance (CMR) compounds. See Jin et al., *Science*, Vol. 264, p. 413 (1994); Jin et al., JOM, Vol. 49, No. 3, March 1997, p. 61; and G. A. Prinz, *Physics Today*, Vol. 4, p. 58 (1995). While resistivity changes by many orders of magnitude are obtained in CMR, such changes typically require the use of very high magnetic fields of 1 tesla or higher. But application of magnetic fields greater than 0.1 tesla (1000 Oe) is not practical for device circuits. Although magnetic fields can be amplified by using soft magnetic poles or cores, continuous power is required for such amplification.

Accordingly, there is a need for circuits wherein one can obtain large and programmable changes in electrical resistivity using practical, low magnetic fields, and without requiring continuous power.

SUMMARY OF THE INVENTION

In accordance with the invention, an electrical or electronic circuit is provided with one or more components of magnetoresistive material and disposed within the gap of a programmable and latchable magnet. This provides the circuit with programmable and latchable resistivity, particularly useful in transformers, amplifiers and frequency tuners.

BRIEF DESCRIPTION OF THE DRAWINGS

The advantages, nature and additional features of the invention will appear more fully upon consideration of the illustrative embodiments described in the accompanying drawings. In the drawings:

FIGS. 6(A)–(C) are graphical representations useful in understanding the latching of the circuit component; and FIG. 7 is a diagram showing programmed and latched electrical resistivity of a La—Ca—Mn—O film in an applied magnetic field.

It is to be understood that these drawings are for purposes of illustrating the concepts of the invention and are not to scale. The same reference numerals are used to designate similar elements throughout the drawings.

DETAILED DESCRIPTION

This disclosure is divided into two parts. Part I describes circuit devices with programmable resistance, typical applications of the devices and their operation. Part II describes exemplary and preferred materials useful in the fabrication of the devices.

I. Circuit Devices

Figure 1:
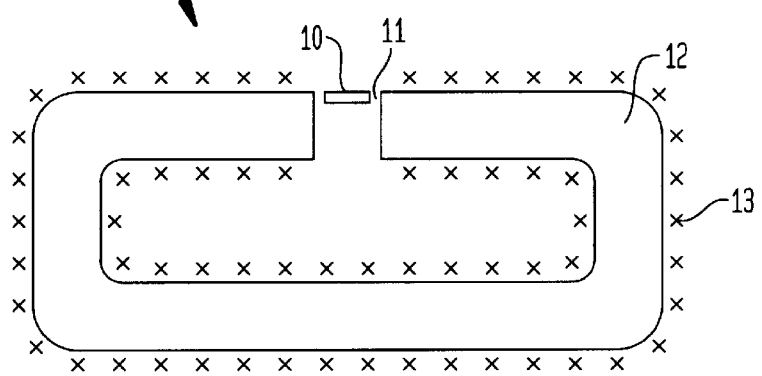
FIG. 1 schematically illustrates an exemplary circuit comprising one or more magnetically tunable and latchable resistance components.

Referring to the drawings, FIG. 1 schematically illustrates an exemplary device 9 comprising a circuit (electrical or electronic) 10 including one or more circuit components with programmable and latchable electrical resistivity. The circuit 10 is disposed in the gap 11 of a programmable and latchable magnet 12 including an activating solenoid 13. Materials for latchable magnet 12 are described in Part II below. The circuit 10 contains one or more magnetoresistive components whose electrical resistivity is dependent on the magnitude of the applied magnetic field. Materials for the magnetoresistive components are described in Part II below.

In operation, the programmable magnet 12 is fed actuating pulse current (to solenoid 13) to generate a predetermined magnitude of magnetic field, and the current is then turned off. The magnet 12 produces a latched, and constant DC magnetic field environment. In this environment the electrical resistance of the magnetoresistive circuit component in circuit 10 is substantially altered and maintained in the altered condition.

Figure 2A:
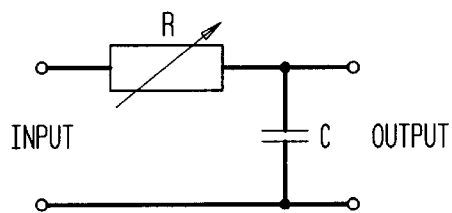
FIGS. 2(A)–(C) are schematic diagrams of typical resonance-determining circuits useful in the device of FIG. 1.
Figure 2B:
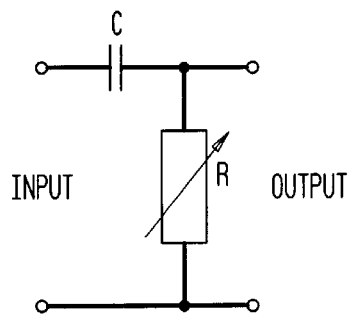
Figure 2C:
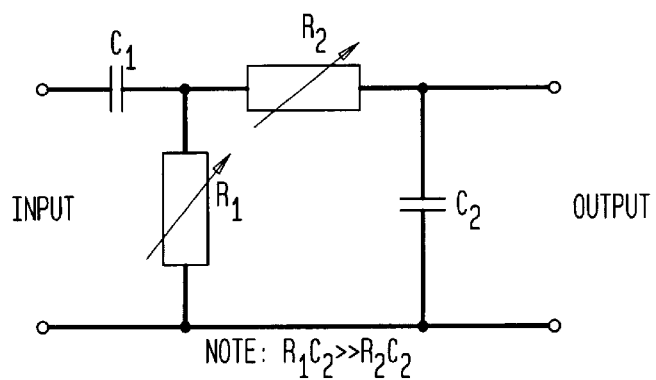

FIGS. 2A, 2B and 2C are schematic circuit diagrams of typical resonance-frequency determining circuits which can comprise circuit 10 of FIG. 1. The elements R, $R_1$ and $R_2$ are magnetoresistive elements having electrical resistance dependent on the applied magnetic field. C, $C_1$ and $C_2$ are conventional capacitors. The programmable and latchable resistance can be used to program and latch the output resonant frequency $f_c$.

In FIG. 2A the components form a C-R low pass filter with a cutoff frequency $f_c=1/(2\pi CR)$. In FIG. 2B they form a C-R high pass filter with a commensurate cutoff frequency. And in FIG. 2C the components are arranged to form a C-R bandpass filter with a lower cutoff at $1/(2\pi C_1 R_1)$ and an upper cutoff at $1/(2\pi C_2 R_2)$.

Figure 3A:
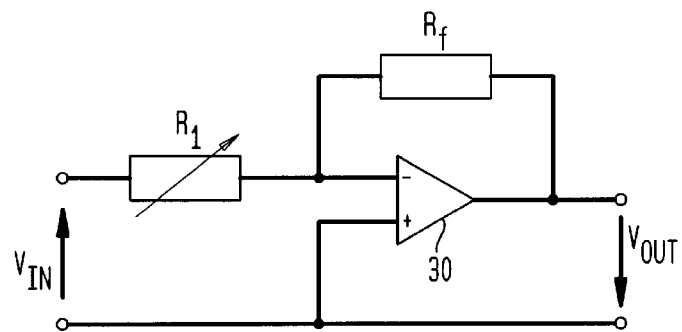
FIGS. 3(A)–(C) are schematic diagrams of typical amplifier circuits useful in the device of FIG. 1.
Figure 3B:
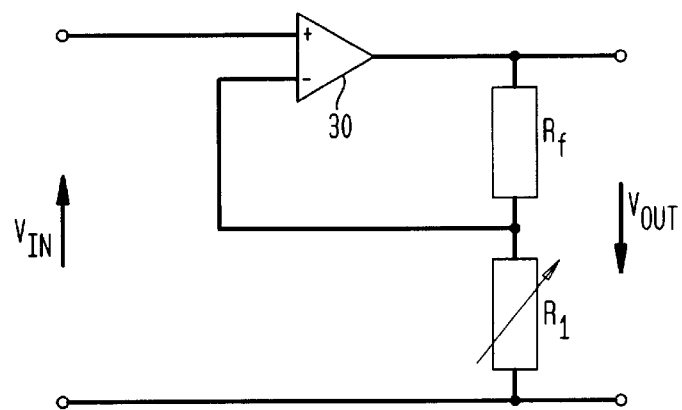
Figure 3C:
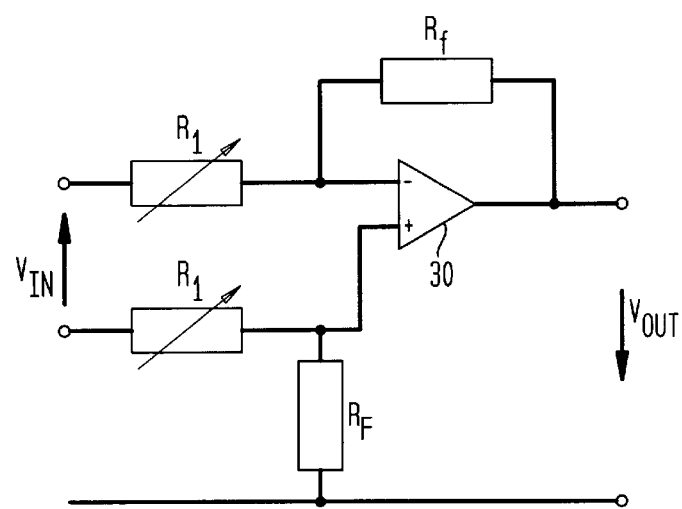

FIGS. 3A, 3B and 3C are schematic circuit diagrams of typical amplifier circuits which can comprise circuit 10 of FIG. 1. The element 30 is an operational amplifier, $R_f$ is a fixed resistor and $R_1$ is a magnetoresistive element to program and latch the amplifier gain. FIG. 3A shows a basic inverting amplifier with a voltage gain $R_1/R_f$ and a phase shift of 180°. FIG. 3B shows a non-inverting amplifier with a gain $1+R_1/R_f$ and no phase shift. FIG. 3C is a differential amplifier with $R_1/R_f$ voltage gain and 180° phase shift.

Figure 4A:
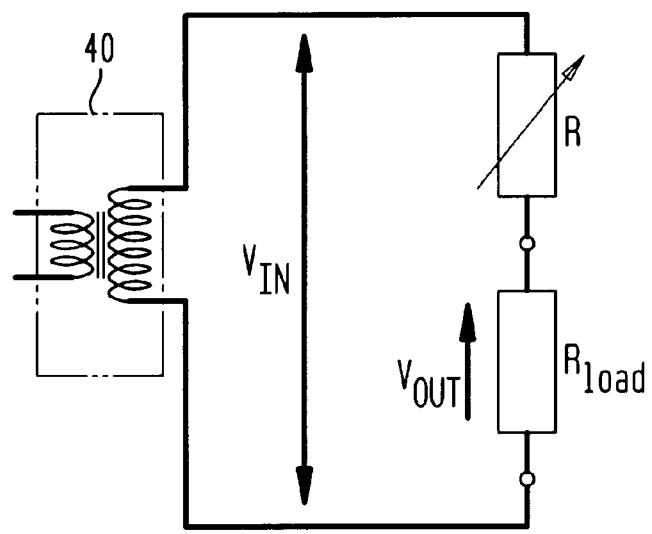
FIGS. 4(A) and 4(B) are diagrams of typical transformer circuits useful in FIG. 1.
Figure 4B:
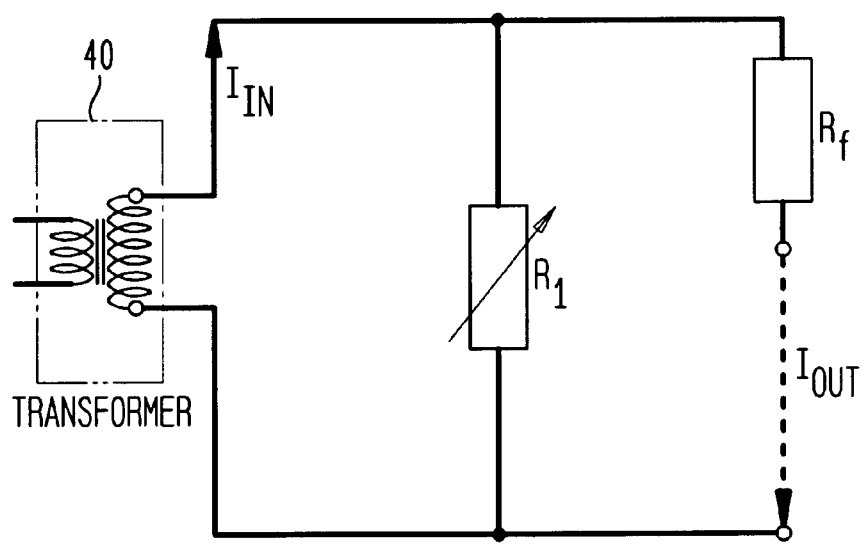

FIGS. 4A and 4B illustrate typical transformer circuits which can comprise circuit 10. The circuits use magnetoresistive elements R, $R_1$ and fixed resistances $R_f$ and $R_{load}$ to program and latch the output voltage and current levels from a transformer 40. FIG. 4A shows a variable voltage divider with voltage output $V_{out}$ given by $$V_{out}=(V_{in} \times R_{load})/(R+R_{load}).$$

FIG. 4B is a variable current divider with current output:

$$I_{out}=I_{in} \times R_1/(R_1+R_f).$$

It should be noted that fixed resistors $R_f$ could also be magnetoresistive elements controlled by a separate magnet from $R_1$ to enhance the tuning ranges of the circuits.

The circuits of FIGS. 2, 3 and 4 can be fabricated on semiconductors such as Si or on insulating substrates such as $S_iO_2$ or $Al_2O_3$. Capacitors, inductors and conventional resistors can be formed by conventional thin film circuit fabrication techniques. The magnetoresistive elements can be formed of a thin film of magnetoresistive material and can be defined by thin film techniques.

Figure 5A:
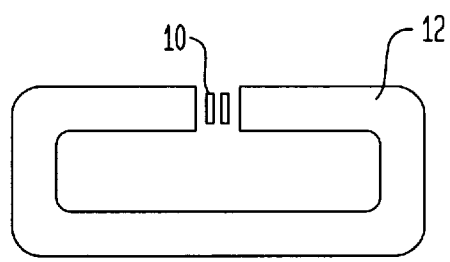
FIGS. 5(A)–(D) illustrate alternative configurations of the FIG. 1 device.
Figure 5B:
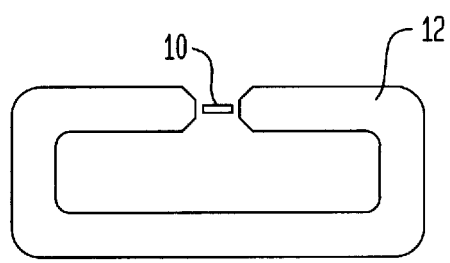
Figure 5C:
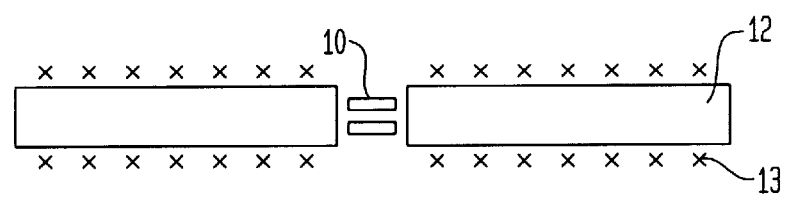
Figure 5D:
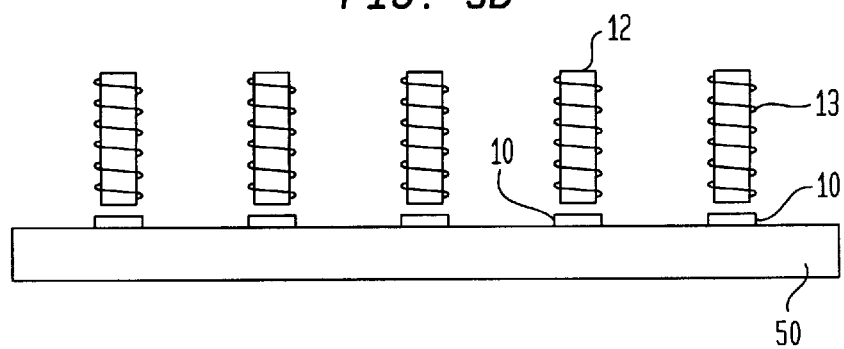

FIGS. 5A–5D show various alternative configurations of the device 9 using different configurations of the programmable and latchable magnet 12 (solenoid windings not shown). In general, closed-loop magnet configurations such as in FIGS. 5(A) and 5(B) are desired for minimizing the leakage flux. However, the linear arrangement of FIG. 5(C) can also be useful for other physical or magnetic design considerations, e.g., for increasing the skewness of the M-H hysteresis loop. The circuit 10 device may be placed parallel or perpendicular to the magnetic field depending on the orientation of the magnetoresistive component. A single layer, or multiple layers of circuits may be placed in the gap. The ends of the magnetic poles may be flat, convex (for field concentration) or concave (for field uniformity and parallelness). FIG. 5(D) illustrates a series arrangement of the circuit device. Each device is separately actuated by a corresponding latchable magnet with its own solenoid winding to create a desired level of electrical resistance for each device. The circuits are mounted on a common substrate 50.

II. Materials

A. Latchable Magnet Materials

The programmable magnet 12 is advantageously made of a material whose magnetic properties are modifiable by a pulse magnetic field. Some examples of suitable magnets are Fe—Cr—Co, Fe—Al—Ni—Co (Alnico), Cu—Ni—Fe (Cunife), Co—Fe—V (Vicalloy), specially-processed, low-coercivity ($H_c$) rare earth cobalt (Sm—Co) or Nd—Fe—B magnets, and Ba-ferrite or Sr-ferrite magnets. The desired range of the coercivity for the programmable magnet is typically below 500 Oe and preferably below 100 Oe for the ease of programming by remagnetization using solenoid pulse field. The coercivity is typically above 10 Oe and preferably above 30 Oe for maintaining the stability of the remanent magnetization and also for stability against demagnetization due to stray magnetic fields.

For satisfactory latchability of magnetization when the field is removed, the programmable magnet should have a square magnetization hysteresis loop with the squareness ratio (remnant magnetization/saturation magnetization) of at least 0.85, preferably at least 0.90, even more preferably at least 0.95. For ease of control, the loop is desirably skewed by at least 50% of $H_c$. Mechanically ductile and easily formable or machineable magnet alloys such as Fe—Cr—Co, Cu—Ni—Fe, Co—Fe—V are particularly desirable for shaping into a desired configuration such as a rod. Stable permanent magnets with high coercive forces (e.g., $H_c$>1000 Oe), such as Sm—Co or Nd—Fe—B are less desirable (unless modified to exhibit lower coercive forces) because of the difficulty in reprogramming the remanent magnetization using desirably low magnetic field. The magnet 12 is provided with solenoid windings for conducting actuating current.

FIGS. 6(A)–(B) are graphical illustrations of M-H and ρ-H loops useful in understanding the advantageous programmable and latchable behavior of the magnet. After a pulse or short-duration current to the solenoid is applied for actuation, the field in the gap is altered and latched at a certain value. The field in turn, alters and latches the electrical resistance of the magnetoresistive element in the circuit. Electrical power is no longer needed to be supplied continuously. For a continuous tuning of resistance, the square loop characteristic of resistance vs applied magnetic field is not always desirable as the steep side of the curve in FIG. 6(A) can pose a control problem when a certain intermediate resistance is desired.

For ease of controlling the resistance, the M-H and ρr-H loop can be skewed as in FIG. 6(B). This is achieved by increasing the self-demagnetizing field of the magnets e.g., by either increasing effective diameter of the magnet or reducing the length and thus decreasing the magnet length-to-diameter aspect ratio. The optimal skewing of the loop is as illustrated in FIG. 6(B), i.e., the remanent magnetization or the remanent resistance when the applied field is removed is still essentially the same as the saturation value (at least 90%) and the onset field of rapid decrease of M or r when the field is reversed is near zero field and preferably in the range of ±30% of the coercive force, even more preferably in the range of ±10% of the coercive force ($H_c$).

FIG. 6(C) illustrates an excessive skewing of the M-H or ρ-H loop. Such excess is not desirable as it causes a deterioration of the latchability of resistance in the circuit. A deterioration in latchable resistance is indicated by the arrows.

As a specific example of a programmable magnetic material, an Fe-28%Cr-7%Co alloy is deformation-aged to yield a square M-H loop with $H_c$ of 70 Oe, a dimension of 0.180" diameter and 4" length. The M-H Loop is skewed by ~60 Oe, producing a M-H loop similar to FIG. 6(B). For applied magnetic fields of $H_1$ and $H_2$, the corresponding magnetization is latchably retained after the field is removed, and hence the electrical resistance, $r_1$ and $r_2$ are also latchably retained. Therefore the device can be operated without continuous power. To alter the degree of tuning of the electrical resistance in the circuit, the resistance is altered and latched by changing the magnetization in the programmable magnets. This can be achieved by either increasing the applied field or by demagnetizing first and remagnetizing to a new field level. For magnetization of the magnets using a solenoid, a pulse field (a pulse current in the solenoid) can conveniently be used for high-speed, low-power operation of the devices. The desired duration or speed of the pulse field is typically in the range of $10-10^{-6}$ seconds, preferably $10^{-1}-10^{-4}$ seconds. The shape of the current pulse applied can be sinusoidal, rectangular, trapezoidal, triangular or irregular.

B. Magnetoresistive Materials

The magnetoresistive components 20 are advantageously made of a magnetoresistive material having a high MR ratio of at least 10% at a field environment of 500 Oe and preferably at least 50%. In a preferred embodiment, the magnetoresistive film is a compound of the form $A_wB_xC_yO_z$ where A is chosen from one or more rare earth elements (La, Y, Ce, Nd, Sm, Eu, Tb, Dy, Ho, Er, Tm, Yb, and Lu), B is chosen from one or more group IIA elements of the periodic table (Mg, Ca, Sr, and Ba), or other elements such as Pb or Cd, and C is chosen from Cr, Mn, Fe and Co. Advantageously, $0.4 \leq w \leq 0.9, 0.1 \leq x \leq 0.6, 0.7 \leq y \leq 1.5$, and $2.5 \leq z \leq 3.5$. Preferably, $0.5 \leq w \leq 0.8$, $0.15 \leq x \leq 0.5$, $0.8 \leq y \leq 1.2$, and $2.7 \leq z \leq 3.3$. In a preferred compound, A is La, B is Ca, Sr, Ba, Pb or their mixture, C is Mn.

The magnetoresistive component can be made from epitaxial or non-epitaxial thin films prepared by physical deposition such as laser ablation, sputtering, evaporation, MBE (molecular beam epitaxy) or by chemical deposition such as electroless, electrolytic, or chemical vapor deposition or other techniques such as plasma spray or screen printing. Alternatively, thick films or bulk materials can also be used.

Fabrication of preferred magnetoresistive material is described in detail in the U.S. Patents to Jin et al., U.S. Pat. No. 5,411,814 issued May 2, 1995, U.S. Pat. No. 5,538,800 issued Jul. 23, 1996, and U.S. Pat. No. 5,549,977 issued Aug. 27, 1996, all of which are incorporated herein by reference. A preferred processing of such a material, e.g., La—Ca—Mn—O, into a thin film configuration is as follows. Typically about 500–2000 Å thick films are deposited on a nearly lattice-matched substrate such as a (100) $LaAlO_3$ substrate by pulsed laser ablation using a target of the similar composition. The pulsed laser deposition is carried out in a partial oxygen atmosphere of 50–500 mTorr with the substrate temperature of 500–900° C. The film is subsequently heat treated at 700–1000° C. for 0.1–24 hours in an oxygen-containing atmosphere. Other insulating substrates such as $SrTiO_3$ and MgO may also be used. It is preferable to have some epitaxy or at least some c-axis texture for higher MR ratio in the film. Other non-lattice matching substrates such as $Al_2O_3$ or Si may be used, preferably with a suitable buffer layer added for epitaxy or electrical insulation purpose. Alternatively, instead of the manganites described above, semiconductors with high magnetoresistance, such as indium antimonide (In—Sb) may be used.

FIG. 7 is a diagram plotting the reprogrammed electrical resistivity of a $La_{0.67}Ca_{0.33}MnO_x$ film vs. applied magnetic field. The magnetoresistive film, about 1000 Å thick, was fabricated by laser ablation deposition on a $LaAlO_3$ substrate. During deposition, a substrate temperature of ~700° C. and oxygen partial pressure of 100 mTorr were maintained. The deposited film was heat treated at 850° C. for 0.5 h in a 3 atmosphere oxygen atmosphere. The resistivity measurement was carried out at slightly above the liquid nitrogen temperature (~80 K), using the well-known four-point technique of measuring the voltage change at a constant current.

The latched magnetic field from the magnetic gap between two Fe-28%Cr-7%Co latchable magnets and solenoid winding was measured by Hall probe as a function of applied voltage in the solenoid. The Fe—Cr—Co magnets were deformation-age processed (see article by S. Jin, *IEEE Trans. Maan.* Vol. 15, p. 1748, 1979) by initial two phase separation heat treatment, followed by uniaxial tensile deformation to elongate the ferromagnetic phase and then final heat treated to adjust the coercivity. The heat treatment conditions and magnet geometry were selected to produce desirable low coercivity (~99 Oe) for lowfield operation, yet high latchability of magnetization of at least 90% after the applied solenoid field is removed. The gap between the two magnets, each 4 inches long and 0.185 inch in diameter, was kept at 0.010 inch. The solenoid winding had 5000 turns.

As indicated in FIG. 7, a solenoid pulse field (a few milliseconds) of ~150 Oe generated an induced and latched field in the gap of 1 tesla, which is sufficient to alter the resistivity of La—Ca—Mn—O film from 36 W.cm to 0.038 W.cm, almost a thousand-fold reduction. The resistivity can easily be reprogrammed. For example, following the operation principles described earlier with FIG. 6, altering the latchable magnetic field to 0.5 tesla (e.g. by altering the solenoid pulse field to ~90 Oe) changes the resistivity to be modified to 0.57 W.cm. By optimizing the device structure and materials, a circuit component resistance change, e.g., by more than four orders of magnitude can be induced by a short pulse of relatively low and practical field level of a few hundred oersteds. Such a large change in resistance can be utilized in the design of digital devices, switches, and transistors.

It is to be understood that the above-described embodiments are illustrative of only a few of many possible specific embodiments which can represent applications of the invention. Numerous and varied other arrangements can be made by those skilled in the art without departing from the spirit and scope of the invention.

What is claimed is:

1. An article comprising:
    at least one electrical or electronic circuit, said circuit including at least one resistor of magnetoresistive material comprising a compound of the form $A_wB_xC_yD_z$ where A is chosen from one or more rare earth elements, B is chosen from one or more elements selected from Pb, Cd or Group IIA elements and C is chosen from Cr, Mn, Fe and Co;
    a programmable and latchable magnet magnetically coupled to said circuit, whereby the resistance of said resistor can be latchably controlled by said magnet.

2. An article according to claim 1 wherein said circuit comprises a frequency determining circuit and the frequency is varied by said magnet.

3. An article according to claim 1 wherein said circuit comprises an amplifying circuit and the amplification gain is varied by said magnet.

4. An article according to claim 1 wherein said circuit comprises a transformer circuit and the output voltage is varied by said magnet.

5. An article according to claim 1 wherein the resistance of said resistor varies at least 10% over a magnetic field change of less than 1000 Oe.

6. An article according to claim 1 wherein the resistance of said resistor varies at least 10% over a magnetic field change of less than 300 Oe.

7. An article according to claim 1 wherein the resistance of said resistor varies at least 1000% over a magnetic field change of less than 1000 Oe.

8. An article according to to claim 1 wherein the resistance of said resistor is latchable when the magnet current is off to 80% of its maximum resistance when the magnetic current is on.

9. An article according to claim 7 wherein the resistance of said resistor is latchable when the magnet current is off to 90% of its maximum resistance when their magnetic current is on.

10. An article according to claim 1 wherein the magnet has a coercivity of less than 200 Oe.

* * * * *